United States Patent [19]
Effenberger et al.

[11] Patent Number: 5,357,726
[45] Date of Patent: * Oct. 25, 1994

[54] COMPOSITE MATERIALS FOR STRUCTURAL END USES

[75] Inventors: John A. Effenberger, Bedford; Keith G. Koerber, Goffstown; Francis M. Enzien, Penacook; Michael P. Cushman, New Boston, all of N.H.; Milton B. Punnett, East Aurora, N.Y.

[73] Assignee: Chemfab Corporation, Merrimack, N.H.

[*] Notice: The portion of the term of this patent subsequent to Aug. 25, 2009 has been disclaimed.

[21] Appl. No.: 119,442

[22] Filed: Aug. 31, 1993

Related U.S. Application Data

[63] Continuation of Ser. No. 617,195, Nov. 23, 1990, abandoned, Continuation-in-part of Ser. No. 305,748, Feb. 2, 1989, abandoned.

[51] Int. Cl.$^5$ .................................................. E04C 1/00
[52] U.S. Cl. ............................... 52/309.7; 52/517; 264/127; 156/161
[58] Field of Search ............. 52/309.7, 309.16, 81, 52/222, 517; 264/127; 156/161, 163

[56] References Cited

U.S. PATENT DOCUMENTS

| | | | |
|---|---|---|---|
| 3,494,727 | 2/1970 | Rapaport | 52/517 |
| 3,740,903 | 6/1973 | Ahern | 52/81 |
| 3,850,674 | 11/1974 | Clarke et al. | 117/76 |
| 4,054,711 | 10/1977 | Botsolas | 52/309.16 |
| 4,212,923 | 7/1980 | Brady | 428/419 |
| 4,322,475 | 3/1982 | Lewis et al. | 428/463 |
| 4,443,511 | 4/1984 | Worden et al. | 264/127 |
| 4,610,918 | 9/1986 | Effenberger et al. | 428/245 |
| 4,749,625 | 6/1988 | Obayashi et al. | 428/624 |
| 4,770,927 | 9/1888 | Effenberger et al. | 428/245 |
| 4,883,716 | 11/1989 | Effenberger et al. | 264/215 |
| 5,075,065 | 12/1991 | Effenberger et al. | 264/137 |
| 5,141,800 | 8/1992 | Keese et al. | 428/267 |

FOREIGN PATENT DOCUMENTS 0159942 10/1985 European Pat. Off. .
1360975 7/1974 United Kingdom .

*Primary Examiner*—James L. Ridgill, Jr.
*Attorney, Agent, or Firm*—Hayes, Soloway, Hennessey, Grossman & Hage

[57] ABSTRACT

A flexible, reinforced textile composite material for constructing tensioned fabric structures, e.g. for sheltering from the outdoor environment, is disclosed. The material has a hydrophobic protective film element laminated to the textile composite material to provide enhanced hydrophobicity. In a preferred embodiment, of the invention, one or a mixture of colorants, dyestuffs or biological agents are incorporated into the hydrophobic protective film layer. The textile composite material has particular application as a tensioned architectural element for forming a dome, roof or the like, or as an electromagnetic window or a radome.

33 Claims, 3 Drawing Sheets

COMPOSITE MATERIALS FOR STRUCTURAL END USES

The present application is a continuation of copending application Ser. No. 07/617,195 filed on Nov. 23, 1990 abandoned, which is a continuation-in-part of copending application Ser. No. 385,748, filed Feb. 2, 1989, now abandoned.

The present invention relates to textile products, and more particularly, to fiber reinforced flexible laminated fluoropolymer-containing composites suitable for outdoor, structural use, and to protective structures comprising flexible fluoropolymer-containing composites. The flexible fluoropolymer-containing composites of the present invention have particular utility as structural architectural materials, e.g. for building "shaded villages" in the desert, or domes over large sports stadia, churches, shopping malls, and the like, as well as in the fabricating of electromagnetic windows or radomes, and will be described in connection with such utility, although other utilities are contemplated.

Since their introduction in the early seventies, the use of flexible fluoropolymer-containing composites as "architectural materials" for constructing so-called "tensioned-fabric structures" has continuously grown. The surge in such application has been associated with the development of an advanced grade of flexible fluoropolymer-containing woven fiberglass composite materials having advantageous mechanical and solar-optical properties along with good soil-release behavior, virtual incombustibility and good weatherability. Fluoropolymer-coated flexible textile substrates, such as polytetrafluoroethylene (PTFE) coated fiberglass or the like, exhibit very good weathering and uniqueness of physical properties such as their very low surface free energy and good balance of solar optical characteristics, favoring their use in architectural structural applications. These properties, coupled with the composite material's inherently high strength to weight ratio, further favors their use in such structural applications.

Particularly important properties of fluoropolymer-coated flexible textile composites intended for architectural tensioned-fabric structural end use is their very low surface free energy and chemical inertness to the natural elements of rain, wind, snow and solar insolation and resistance to biological contamination. Specifically, the extremely low surface free energy of PTFE coated textile composites confers upon a structure made from such a fluoropolymer composite the ability to shed adventitious water and to resist soiling which would otherwise occur as the result of exposure over time to airborne smog, soot, aerosols, etc. which are ubiquitous in the outdoor environment.

It has been found that the surface free energy of PTFE coated fiberglass composites, as manufactured, is about 18–19 ergs/cm$^2$, rendering them highly hydrophobic. However, over time in the outdoors, it has been found that the surface free energy can increase to about 23 ergs/cm$^2$ with occasional areas as high as 28 ergs/cm$^2$. While 23 ergs/cm$^2$ still represents very good hydrophobicity, it represents a sub-optimal value given the inherent properties of PTFE, and may be unacceptably high in structural applications such as radomes where hydrophobicity is a key to microwave transmission. As a result, it is necessary to clean the structure periodically to restore its initial appearance and hydrophobicity.

While not wishing to be bound by theory, it is believed that the increase in surface energy over time is related to the physical surface topography of PTFE coated textile composites. It is known that the coating process itself may not produce a truly smooth, uniform and defect-free (i.e. microcracks, craters, pinholes, etc.) polymeric surface. A direct consequence of the somewhat microcracked surfaces inherent to these composites when produced by a coating methodology is the slow deterioration of such release properties and hydrophobicity. Dirt and microbiological growth can take a "foothold" in such microcracks, particularly as such cracks become larger over time and/or with thermal cycling (diurnal and seasonal). This behavior is discussed in "The Effects of Rain on a Radome's Performance", Microwave Journal, May, 1986 (John A. Effenberger, Richard R. Strickland, Edward B. Joy).

In order to overcome this problem, it has been proposed to use a TFE copolymer to heal the microcracking of the PTFE in the surface of PTFE coated fiberglass composite intended for architectural use. While useful to a degree, the improvement obtained with such treatment does not completely prevent soiling, and to the extent that non-uniformity of coating, and coating defects occur, a surface with variable ability to resist soiling or to exhibit optimal hydrophobicity results, particularly over time in the outdoor environment.

Additionally, since one of the functions of the PTFE in such coated products is to protect the reinforcing glass fibers from the elements, particularly from liquid water, the presence of coating defects such as craters, pinholes, microcracks, etc. represents a compromise in the effective strength of the composite itself necessitating the use of elevated safety factors in designing with such material for structural use.

Another disadvantage associated with PTFE coated fiberglass composites intended for architectural tensioned-fabric structural end-use is the limited ability to incorporate into the composite materials aesthetic effects such as color. While pigmentation of the PTFE is possible, such pigmentation is limited by the deleterious effects of hard, mineral particulates on the effective strength of the reinforcements when incorporated into the coating formulations. Thus, the amount and location of pigment which can be added is severly limited. Additionally, because of the non-uniform topography of a woven reinforcement, and limitations inherent in the dip-coating process used to produce such composite materials, it is not possible to produce a dip-coated composite with a uniformly thin layer of pigment containing PTFE whereby to obtain uniformly intense coloration by reflected light and yet retain a high degree of light transmission.

Moreover, when color is introduced in a PTFE coating process, it is difficult to control both the uniformity and transmissivity of the coated product since the coatings tend to be thicker in the textile "windows" and thinner over the textile "knuckles". Thus, while available for industrial PTFE coated products, colors other than white have not played a significant role in the aesthetically more demanding architectural applications of the PTFE coated products.

Generally, the level of pigmentation required to achieve a uniformly aesthetic effect in a coated product is high enough to substantially reduce the overall light transmission of such composites. This is detrimental to its intended use, for example, as a skylight or solar luminaire.

It is, therefore, an object of the present invention to provide a flexible textile composite material for tensioned-fabric structural end-use which overcomes the aforesaid and other disadvantages of the prior art, and more particularly, to provide flexible fluoropolymer composite materials which are particularly suited to outdoor, structural end-use, and which are characterized by durable hydrophobicity, an ability to resist the deleterious effects of liquid water, and compatibility with architectural design strategies aimed at good light transmission and intense coloration by reflected light.

SUMMARY OF THE INVENTION

In accordance with the present invention, there is provided a flexible, laminated, reinforced textile composite material for structural end-use comprising a fibrous reinforced load-bearing component, said load-bearing component comprising a fibrous reinforced fluoropolymer textile composite material, at least one surface of said composite material being covered, at least in part, by a hydrophobic protective film layer laminated thereto. In a preferred embodiment of the invention, the hydrophobic protective film comprises PTFE and may include one or more additives such as a colorant or dyestuff, or a bactericide such as a fungicide, mildewicide, or the like.

Other objects, advantages and features of the present invention will be apparent and readily understood from the following description of the invention, taken in conjunction with the drawings, in which like reference characters refer to like parts, and wherein:

DETAILED DESCRIPTION OF THE INVENTION

As used herein, the term "textile" shall include naturally occurring and synthetic woven or non-woven materials such as a knit fabric. Any suitable textile material capable of withstanding processing temperatures and able to sustain the static and dynamic mechanical loads in a structure may be employed as the reinforcing material of load bearing composite in accordance with the present invention. Examples include, inter alia, fiberglass, ceramics, graphite (carbon), PBI (polybenzimidazol), polyaramides such as KEVLAR and NOMEX, polyolefins such as TYVEK, polyesters such as REEMAY, polyamides, polyimides, thermoplastics such as KYNAR (PVF$_2$) and TEFZEL (ETFE), polyethersulfones, polyetherimides, polyetherketones, novoloid phenolic fibers such as KYNOL, PTFE, cotton, and other natural and synthetic fibers. The reinforcing material may comprise a yarn filament, monofilament, slit film or the like assembled as a textile. The reinforcing material also may comprise a metallic material such as steel wire or mesh or the like. Preferably the reinforcing material comprises fiberglass.

Figure 1:
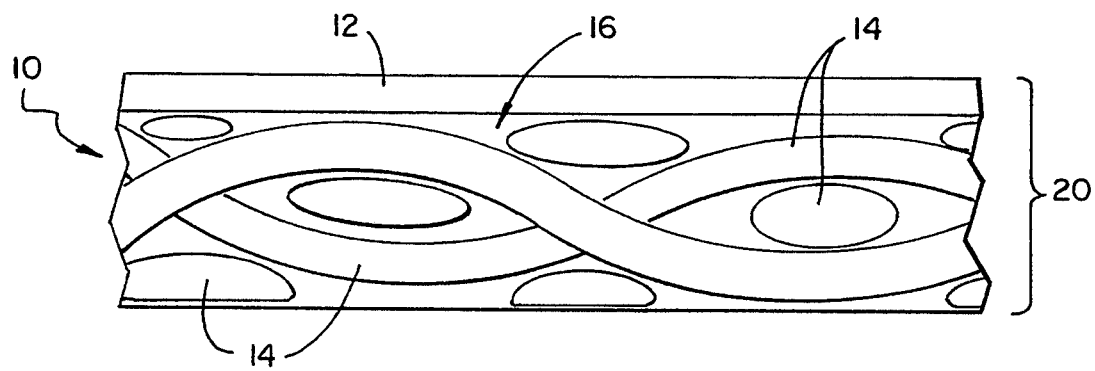
FIG. 1 is a side elevational view, in cross section, of a laminated textile composite material made in accordance with the present invention.

Referring in particular to FIG. 1 of the drawings, there is illustrated a preferred form of a laminated textile composite material 20 made in accordance with the present invention. The textile product comprises a first, load-bearing composite element 10, having a second element 12 formed of a polytetrafluoroethylene-containing film layer laminated to the load bearing element 10.

The composite textile substrate element 10 is formed by coating or impregnating a textile substrate, e.g. fiberglass 14, with PTFE 16 or the like in known manner, for example, by applying the PTFE from a suspension and fusing the applied PTFE, for example in accordance with the teachings of U.S. Pat. No. 3,928,703 to Cook.

The hydrophobic protective film element 12 preferably comprises one or more preformed films, at least one of which comprises a TFE polymer, preferably PTFE, which may be preformed by a variety of known techniques such as melt extrusion, melt casting, skiving and paste extrusion. Additional film elements comprising, for example, the thermoplastic terpolymer of TFE, HFP and VF$_2$ may be employed in combination with the PTFE film.

If desired, one or a mixture of additives may be included in the hydrophobic protective film element 12 for producing a desired effect. For example, a colorant or dye stuff maybe incorporated into the film material, e.g. prior to forming the film so that the resultant film comprises a uniformly dispersed colorant or dye. Also, if desired, one or a mixture of fungicides, bactericides, mildewicides or other biocidal agents may be incorporated into the film so as to result in a film having enhanced resistant to biological contamination.

Figure 2:
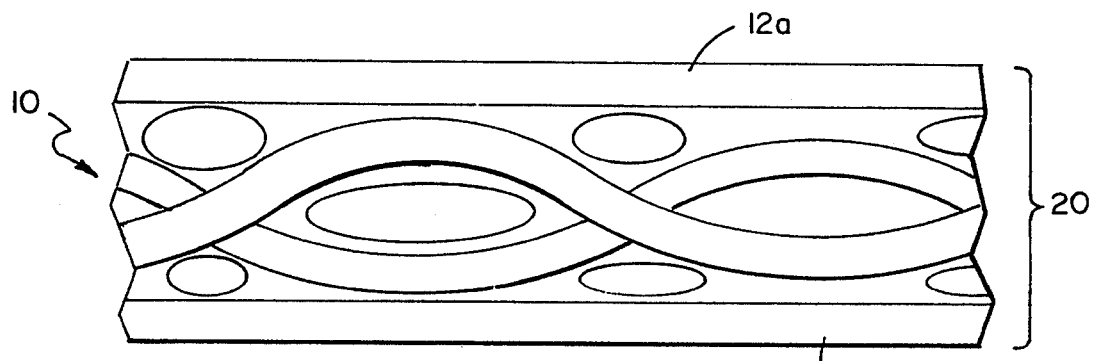
FIG. 2 is a side elevational view, in cross section, of an alternative form of laminated textile composite material made in accordance with the present invention.

Referring to FIG. 2, the laminated textile composite material includes a load-bearing composite textile substrate element 10, sandwiched between hydrophobic protective film elements 12A and 12B, each formed of a polytetrafluoroethylene-containing film.

Figure 3:
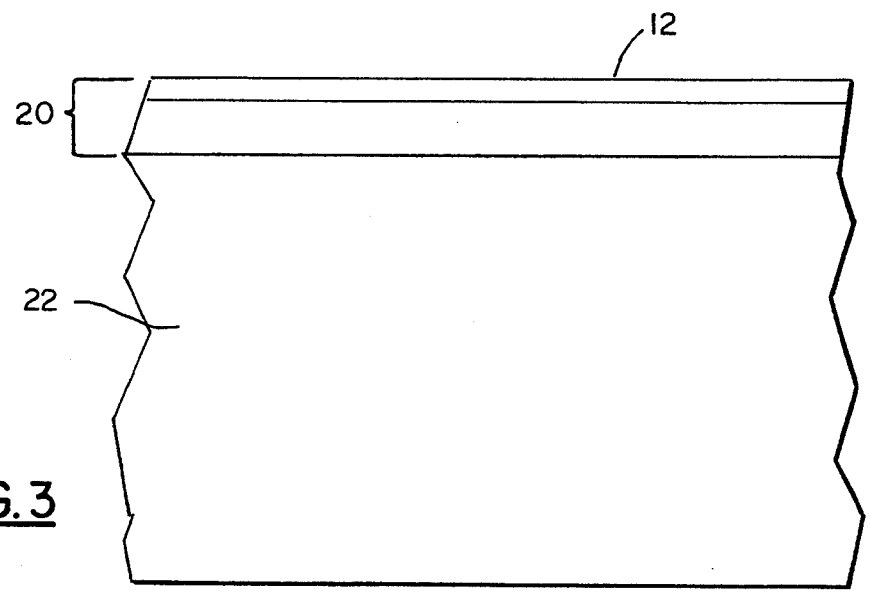
FIG. 3 is a side elevational view, partly in section, showing the use of a laminated textile composite material made in accordance with a preferred embodiment of the present invention as a structural element in a domed structure.

FIG. 3 shows the use of the laminated textile composite material 20 made in accordance with the present invention, as a structural architectural element, for example, in forming a dome. As seen in FIG. 3, the laminated composite material is supported by a supporting frame member 22 with the film element 12 facing the outdoor environment.

The invention, and its advantages may be further seen by the following non-limiting examples which illustrate a preferred method of forming a flexible reinforced laminated composite textile material in accordance with the present invention. The overall process is as follows:

First, the load-bearing textile composite element is formed by impregnating or coating a layer 10 with a fluoropolymer such as PTFE, TFB (Hoechst), KEL-F (3M), or a blend thereof, and the impregnating material is fused by heating the coated/impregnated material.

In Example I, film elements 12A and 12B comprise separately formed cast PTFE films with a thickness of approximately 4.0 mils.

In Example II, a colorant is incorporated into the PTFE film element.

In Example III, the film elements 12A and 12B comprise separately formed cast 1.7 mil PTFE films in which the outermost 0.4 mils on one face remain unfused initially.

EXAMPLE I

A. Production of Laminate

A PTFE coated glass fabric suitable for outdoor, structural end-use (CHEMFAB's RAYDEL M-26 electromagnetic window composite) was employed as substrate element 10 along with a 4 mil perfluoropolymer film element 12 to create a laminated composite 20 in accordance with the present invention. Lamination was facilitated by first applying a top coat of PFA resin to the PTFE coated glass fabric to provide a melt-bondable surface. The perfluoropolymer film (DF-1700 PFA available from Chemical Fabrics Corporation, "CHEMFAB") consisted of 3.8+ mils of PTFE and 0.1+ mils of PFA on one of its surfaces.

Lamination was accomplished by passing a "sandwich" of the film on both sides of the top-coated substrate such that the film/substrate interface is PFA-to-PFA between a succession of heated platens which were set at 400 degrees, 600 degrees and 700 degrees F., and finally between cooling platens set at 55 degrees F. At a feed rate of 1.5 ft/min, the exiting laminate had a temperature of 440 degrees–470 degrees F. The applied pressure in the platens was less than 4 psi, and the laminating "work" (coated substrate plus films) was supported between lightly coated TCGF carriers as it passed between the platens.

Properties of the laminated composite (LEOD-87-3) thus prepared are as follows:

TABLE I

| PROPERTY | UNITS | VALUE(b) |
| --- | --- | --- |
| Weight(a) | $oz/y^2$ | 36.0 +/− 0.1 |
| Thickness | .001 in | 26.5 +/− 0.3 |
| Tensile Strength | lb/in | |
| warp | | 515 +/− 16 |
| fill | | 496 +/− 29 |
| Tear Strength | (lb) | |
| warp | | 40 +/− 2 |
| fill | | 55 +/1 1 |

(a) The fiberglass reinforcement of the coated substrate weighed 9 $oz/y^2$ with warp and fill yarns of ECC 150 2/2 fiberglass at a count of 28 × 29 respectively.
(b) Mean value and standard deviation based on n = 10 (except for weight and thickness for which n = 4).

These are consistent with expectations given that the coated substrate weighed 22.5 $oz/y^2$ and was 18.0 mils in thickness.

It is well known that the success of PTFE coated fiberglass in outdoor structural end-use is largely due to its inertness to the ubiquitous elements associated with the outdoor environment: namely sunlight (particularly ultra-violet radiation), water (liquid and vapor), and oxidizing gases (oxygen and "smogs"), over a significant range of temperatures.

Experimental data (E. Takabatake: Nitto CHEMFAB Co., Ltd.; Proceedings of the International Association of Shell Structures; Dresden, Germany, September, 1990) has confirmed that deterioration of the strength of PTFE coated fabrics may be accelerated by immersion of such composites in water at elevated temperature. Indeed, liquid water is believed to be a significant causative agent for the slow mechanical deterioration of such composites in outdoor structural use. Real-time weathering data has indicated that about 25% of the tensile strength of such coated composites can be lost after fifteen years. Since such deterioration necessitates an increase in mechanical design safety factors governing the outdoor structural use of such composites, this will in general translate into the need for heavier, stronger and more costly composites. Thus, there is a signficant premium attached to the use of PTFE coated composites in such use.

B. Evaluation of Laminate

In order to evaluate the laminated PTFE composite of the present invention for its ability to better resist the mechanical deterioration induced by liquid water, the laminate PTFE composite prepared in Example I, Part A, was subjected to the action of concentrated, aqueous, alkaline solutions. The elevated pH was employed so that any hydrolysis due to liquid penetration of the composite would be accelerated.

In a preliminary evaluation, a box-like container was fabricated from the laminate prepared in Example I, Part A, and filled with 40% aqueous NaOH. The container was then placed in a hot water bath to maintain the temperature of its contents at 60 degrees–70 degrees C. for 8–9 hours on each of five days with a total exposure extending over seven days. No effect of such exposure was observed on either the tensile or tear strength of the laminate.

Subsequently, an apparatus was set up to allow a one-sided exposure of this same laminate to both a 50% aqueous NaOH solution at 60 degrees+/−5 degrees C., and to a 12.5% solution of NaOCl ("Super Shock") at 60 degrees+/−5 degrees C. Also included as a control in the evaluation was a PTFE coated fiberglass composite, CHEMFAB'S DARLYN ® 1100, which is noted for its outstanding inertness in hot, corrosive, environments.

As may be seen from the data of Table II, the laminated product prepared in accordance with Example I, Part A (based upon a film comprised of PTFE as well as a coated substrate comprised of PTFE) is clearly superior in its ability to remain unaffected by exposure to liquid water even at elevated pH. This is, presumably, a reflection of the inability of the liquid water to penetrate to the reinforcement due to the more perfect state of consolidation of the PTFE polymeric matrix when incorporated into the composite as a film.

TABLE II

| TENSILE STRENGTH: (lb/in) | | |
| --- | --- | --- |
| (A) Effect upon Tensile Strength (Warp) of Exposure to Aqueous NaOH or at 60 +/− 5 degrees C. | | |
| | Unexposed | Exposure: 259 Hrs. | Exposure: 500 Hrs. |
| LEOD-87-3: (laminated) | | | |
| Mean | 567 | 519 | 541 |
| Range(1) | 564–571 | 492–544 | 524–582 |
| DARLYN ® 1100: (coated) | | | |
| Mean | 1616 | 1026 | 709 |
| Range(1) | 1602–1635 | 422–1478 | 391–1123 |
| (B) Effect Upon Tensile Strength (Warp) of Exposure to Aqueous NaOCl at 60 +/− 5 degrees C. | | |
| | Unexposed | Exposure: 264 Hrs. |
| LEOD-87-3 (laminated) | 567 | 583 |
| DARLYN ® 1100 (coated) | 1616 | 1324 |

(1) The dramatic increase in the range of measured values for the coated PTFE composite (DARLYN ® 1100) relative to the laminated PTFE composite (LEOD-87-3) is also indicative of the superiority of the laminate to such exposure.

EXAMPLE II

A. Production of Laminate

The films employed on each face of this laminate were multilayered PTFE films with one face comprised of PTFE in an unfused condition to promote lamination by the method of copending application Ser. No. 305,748, assigned to the common assignee. One film was an all PTFE film; the other film was a multi-layer construction with 0.4 mils of clear PTFE, followed by 0.2 mils of PTFE containing 2% by weight of red iron oxide, and followed again by 0.2 mils of PTFE containing 5% "Velveteen" black carbon. The final 0.2 mils is a clear, unfused PTFE. Thus, the pigment determining the hue of reflected light appear in two layers constituting only 0.4 mils of the overall thickness of the PTFE.

These multilayered films were laminated to a previously formed PTFE coated fabric containing about 70% by weight PTFE and 4.0 oz/y$^2$ of fiberglass. In accordance with copending application Ser. No. 305,748, the outermost 1.24 oz/y$^2$ of PTFE were left unfused to serve as a bonding layer for the films.

B. Evaluation of Laminate

The final laminate weighs 15 oz/y$^2$ and has a thickness of 10.0 mils with a tensile strength of about 200×200 lb/in.

Figure 4:
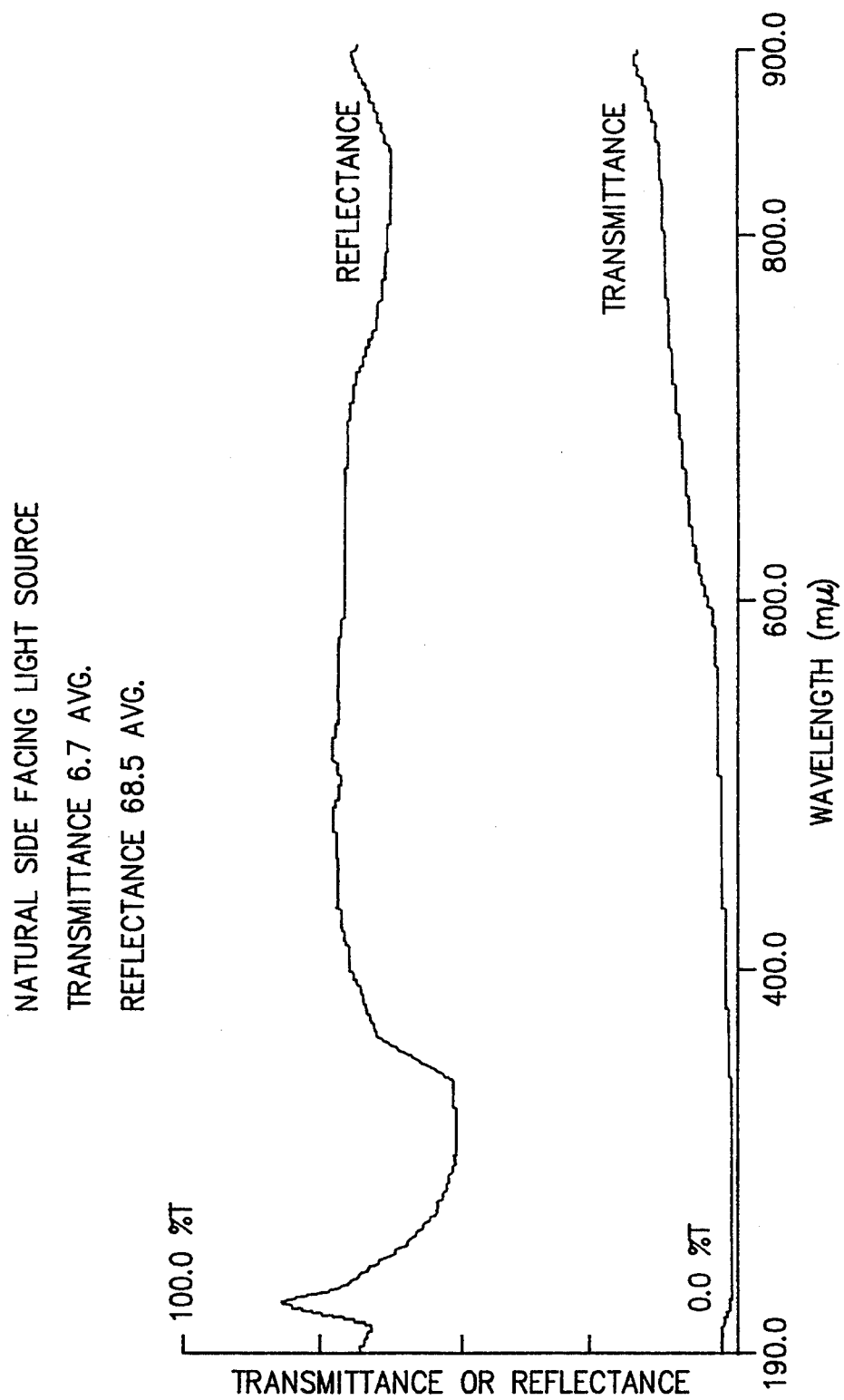
FIGS. 4 and 5 illustrate transmittance and reflectance of a laminated textile composite material made in accordance with the present invention over a range of electromagnetic radiation between 190 m$\mu$ and 900 m$\mu$.
Figure 5:
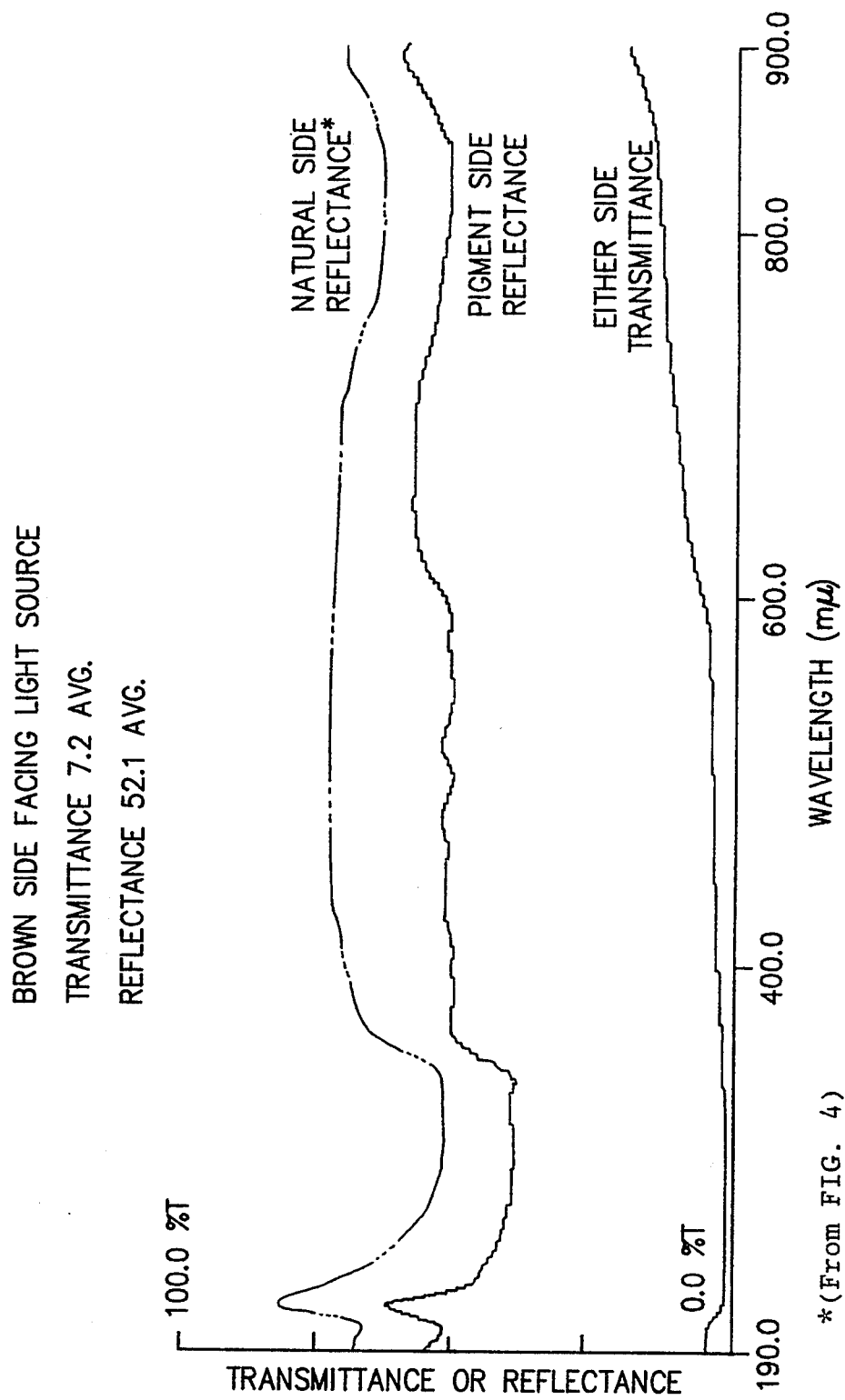

The resulting laminate was tested for light transmission and reflectivity and the results plotted in FIGS. 4 and 5. An overall transmission of about 7% was observed. This transmission level is typical of that obtained in a domed stadium based upon a coated PTFE composite such as SHEERFILL® II from CHEMFAB.

However, the reflectance from one side (the "natural" or unpigmented side) is 68.5% while that from the side which has been laminated with a brown pigmented film is 52.1%.

This demonstrates the ability to employ pigmented films to differentially (face to face) control the overall "shading" (transmission) obtainable from a given composite, as well as the color and level of reflected light. This is a highly desirable feature in a skylight material.

Also providing hydrophobic films on both sides of the textile composite fabric will render both surfaces of the installed composite fabric hydrophobic and soil resistant.

EXAMPLE III

A. production of Laminate

The fiberglass reinforcement weight 4 oz/y$^2$ and is based on plain woven D450 2/2 yarns at a count of 38×36 (warp and fill). A PTFE coating of 9.8 oz/y$^2$ was applied by well known dip coating methodology, except that an additional 1.2 oz/y was applied in a last pass which remained unfused since the highest processing temperature on that pass was 595 degrees F. A specific gravity of 1.49+/−0.01 was employed for each dip using Teflon® 3013 and TE-3313 dispersions.

The film used in lamination was 1.7 mils thick of which the outermost 0.4 mils on one face remained unfused. A layer of film was laminated to each face of the coated substrate, mediated by the unfused PTFE surfaces of each component using the lamination techniques described in Example 1.

B. Evaluation of Laminate

The final laminate was tested in a Q-UV(B) accelerated weathering tester, the contact angle to water determined by means of a Goniometer, and the results reported in Table III.

TABLE III

| Effect of Q-UV Exposure on Laminated PTFE Composites(2) | | |
|---|---|---|
| Time of Exposure(1) (hrs) | Contact Angle(2) to Water (degrees) | Relative Hydrophobicity (RH)(3) |
| 0 | 97.1 | 1.000 |
| 214 | 104.2 | 1.346 |
| 602 | 103.6 | 1.308 |
| 824 | 105.1 | 1.400 |
| 1013 | 109.2 | 1.707 |

(1) Total elapsed time of exposure, about one half of which in exposure to UV-B radiation; the other half involves an aqueous spray, absent radiation.
(2) Unconnected for granitational effects at angles above 90°.

(3) Calculated from $RH = \frac{Cos^4 \theta o/2}{Cos^4 \theta t/2}$ where $\theta$ = contact angle.

Defined in this way higher values of relative hydrophobicity correspond to lower values of surface free energy.

This increase in relative hydrophobicity upon exposure in a Q-UV(B) accelerated weathering tester is unlike the decrease reported for conventionally coated PTFE composites.

The observed durable hydrophobicity makes such a product an outstanding structural composite based on its related low surface energy and therefore soil-releasing capability.

Various changes may be made in accordance with the foregoing invention without departing from the spirit and scope of the present invention.

We claim:

1. A tensioned-fabric structure comprising a supporting element holding a textile composite material comprising
   a. a fibrous reinforced load-bearing element having a textile component and a coating component, said coating component comprising a TFE polymer; and
   b. at least one preformed hydrophobic protective film element comprising a TFE polymer and including one or a mixture of additives selected from the group consisting of a colorant, a dyestuff and a biological agent;
   wherein at least one surface of said load-bearing element is laminated, at least in part, to said preformed hydrophobic protective film element.

2. A structure as claimed in claim 1 wherein said fibrous reinforced load-bearing element is sandwiched between hydrophobic protective film elements laminated thereto.

3. A structure according to claim 1 wherein said biological agent comprises a fungicide.

4. A biological agent according to claim 1 wherein said biological agent comprises a bactericide.

5. A structure according to claim 1 wherein said biological agent comprises a mildewicide.

6. A structure according to claim 1 wherein said preformed hydrophobic protective film element comprises a cast PTFE film.

7. A structure according to claim 1 wherein said preformed hydrophobic protective film element comprises a skived PTFE film.

8. A structure according to claim 1 wherein said preformed hydrophobic protective film element comprises a paste-extruded PTFE film.

9. A structure according to claim 1 in the form of a dome, roof, atria, skylight or architectural accent.

10. A structure according to claim 1 in the form of an electromagnetic window or radome.

11. A structure according to claim 1 in the form of an environmental enclosure or shelter.

12. A structure according to claim 1 wherein said textile component is selected from the group consisting of natural and synthetic fibers.

13. A structure according to claim 1 wherein said textile component is selected from the group consisting of a metal, a graphite and a ceramic.

14. A structure according to claim 1 wherein said textile component is in the form of a fiber, a filament, a slit film or a yarn assembled as a textile.

15. A structure according to claim 1 wherein said fibrous reinforced load-bearing element comprises fiberglass.

16. A structure according to claim 1, wherein said film element comprises a plurality of film layers laminated to one another.

17. A structure according to claim 16, wherein at least the film layer outer-most of said laminate comprises PTFE.

18. A structure according to claim 17, wherein one or more film layers interior of said outer-most layer comprises one or a mixture of colorants, dyestuffs and biological agents.

19. An improved architectural material for constructing tensioned fabric structures, said material comprising a flexible, laminated, reinforced textile composite comprising
  a. a fibrous reinforced load-bearing element having a textile component and a coating component, said coating component comprising a TFE polymer; and
  b. at least one preformed hydrophobic protective film element comprising a TFE polymer and including one or a mixture of additives selected from the group consisting of a colorant, a dyestuff and a biological agent;

wherein at least one surface of said load-bearing element is laminated, at least in part, to said preformed hydrophobic protective film element.

20. An architectural material according to claim 19, wherein said load-bearing element is sandwiched between hydrophobic protective film elements laminated thereto.

21. An architectural material according to claim 19, wherein said biological agent comprises a fungicide.

22. An architectural material according to claim 19, wherein said biological agent comprises a bactericide.

23. An architectural material according to claim 19, wherein said biological agent comprises a mildewicide.

24. An architectural material according to claim 19, wherein said textile component is selected from the group consisting of natural and synthetic fibers.

25. An architectural textile composite material according to claim 19, wherein said textile component is selected from the group consisting of a metal, a graphite or a ceramic.

26. An architectural material according to claim 19, wherein said textile component is in the form of a fiber, a filament, a slit film or a yarn, assembled as a textile.

27. An architectural material according to claim 19, wherein said fibrous reinforced load-bearing element comprises fiberglass.

28. An architectural material according to claim 19, wherein said preformed hydrophobic protective film element comprises a cast PTFE film.

29. An architectural material according to claim 19, wherein said preformed hydrophobic protective film element comprises a skived PTFE film.

30. An architectural material according to claim 19, wherein said preformed hydrophobic protective film element comprises a paste-extruded PTFE film.

31. An architectural material according to claim 19, wherein said preformed hydrophobic protective film element comprises a plurality of film layers laminated to one another.

32. An architectural material according to claim 31, wherein at least the film layer outer-most of said laminate comprises PTFE.

33. An architectural material according to claim 32, wherein one or more film layers interior of said outer-most layer comprises one or a mixture of colorants, dyestuffs and biological agents.

* * * * *